United States Patent
de Jong et al.

(10) Patent No.: US 9,991,087 B2
(45) Date of Patent: Jun. 5, 2018

(54) SPECTROSCOPY IN A TRANSMISSION CHARGED-PARTICLE MICROSCOPE

(71) Applicant: FEI Company, Hillsboro, OR (US)

(72) Inventors: Erwin Fernand de Jong, Best (NL); Sorin Lazar, Eindhoven (NL); Peter Christiaan Tiemeijer, Eindhoven (NL); Rudolf Geurink, 's-Hertogenbosch (NL)

(73) Assignee: FEI Company, Hillsboro, OR (US)

( * ) Notice: Subject to any disclaimer, the term of this patent is extended or adjusted under 35 U.S.C. 154(b) by 0 days. days.

(21) Appl. No.: 14/860,586

(22) Filed: Sep. 21, 2015

(65) Prior Publication Data

US 2016/0086762 A1    Mar. 24, 2016

(30) Foreign Application Priority Data

Sep. 22, 2014  (EP) .................................... 14185799

(51) Int. Cl.
| | |
|---|---|
| *H01J 37/05* | (2006.01) |
| *H01J 37/21* | (2006.01) |
| *H01J 37/244* | (2006.01) |
| *H01J 37/26* | (2006.01) |
| *H01J 37/20* | (2006.01) |
| *H01J 37/285* | (2006.01) |

(52) U.S. Cl.
CPC ............. *H01J 37/05* (2013.01); *H01J 37/20* (2013.01); *H01J 37/21* (2013.01); *H01J 37/244* (2013.01); *H01J 37/26* (2013.01); *H01J 37/285* (2013.01); *H01J 2237/0455* (2013.01); *H01J 2237/057* (2013.01); *H01J 2237/24485* (2013.01); *H01J 2237/2802* (2013.01)

(58) Field of Classification Search
None
See application file for complete search history.

(56) References Cited

U.S. PATENT DOCUMENTS

| | | | |
|---|---|---|---|
| 4,086,491 A | * | 4/1978 | Vaughan ................... G01T 1/29 250/311 |
| 4,612,440 A | | 9/1986 | Brunnee et al. |
| | | | (Continued) |

OTHER PUBLICATIONS

"Electron Microscope", Wikipedia, Accessed Oct. 15, 2015, 11 pages. <https://en.wikipedia.org/wiki/Electron_microscope>.

(Continued)

*Primary Examiner* — Michael Logie
(74) *Attorney, Agent, or Firm* — Scheinberg & Associates, P.C.; Michael O. Scheinberg

(57) ABSTRACT

An imaging system for directing a flux of charged particles transmitted through a specimen onto a spectroscopic apparatus, wherein the flux is dispersed by a dispersing device into an energy-resolved array of spectral sub-beams propagating substantially parallel to a propagation axis. An adjustable aperture device defines an aperture in a path of the array so as to select a subset of the array to be admitted to a detector, which aperture is delimited in a dispersion direction perpendicular to the propagation axis to allow independent adjustment of both of: a width of the aperture parallel to the dispersion direction; and a position of a center of the aperture relative to the propagation axis.

9 Claims, 5 Drawing Sheets

(56) References Cited

U.S. PATENT DOCUMENTS

| | | | | |
|---|---|---|---|---|
| 5,895,736 | A * | 4/1999 | Nakajima | B82Y 10/00 250/492.3 |
| 6,184,524 | B1 * | 2/2001 | Brink | H01J 37/05 250/305 |
| 6,392,228 | B1 * | 5/2002 | Jouffrey | H01J 37/05 250/305 |
| 7,085,355 | B1 * | 8/2006 | Albagli | G21K 1/02 378/147 |
| 7,642,513 | B2 | 1/2010 | Pinna et al. | |
| 8,334,512 | B2 | 12/2012 | Luecken et al. | |
| 8,653,457 | B2 | 2/2014 | Stoks | |
| 2001/0052744 | A1 | 12/2001 | Tsuno | |
| 2007/0257207 | A1 * | 11/2007 | Frosien | H01J 37/09 250/492.3 |
| 2011/0278451 | A1 * | 11/2011 | Tiemeijer | H01J 37/05 250/307 |
| 2012/0049060 | A1 * | 3/2012 | Luecken | H01J 37/05 250/305 |
| 2012/0112089 | A1 * | 5/2012 | Lang | H01J 37/02 250/396 R |
| 2015/0009489 | A1 | 1/2015 | Mulders et al. | |

OTHER PUBLICATIONS

"Scanning Electron Microscope", Wikipedia, Accessed Oct. 15, 2015, 18 pages. <https://en.wikipedia.org/wiki/Scanning_electron_microscope>.

"Transmission Electron Microscopy", Wikipedia, Accessed Oct. 15, 2015, 23 pages. <https://en.wikipedia.org/wiki/Transmission_electron_microscopy>.

"Scanning Transmission Electron Microscopy", Wikipedia, Accessed Oct. 15, 2015, 5 pages. <https://en.wikipedia.org/wiki/Scanning_transmission_electron_microscopy>.

"Scanning Helium Ion Microscope", Wikipedia, Accessed Oct. 15, 2015, 2 pages. <https://en.wikipedia.org/wiki/Scanning_Heliumn_Ion_Microscope>.

W. H. Escovitz et al., "Scanning Transmission Ion Microscope with a Field Ion Source", Proc. Nat. Acad. Sci. USA, vol. 72, No. 5, pp. 1826-1828, May 1975, 3 pages.

"Electron Energy Loss Spectroscopy", Wikipedia, Accessed Dec. 1, 2015, 5 pages. <https://en.wikipedia.org/wiki/Electron_energy_loss_spectroscopy>.

"Energy Filtered Transmission Electron Microscopy", Wikipedia, Accessed Dec. 1, 2015, 2 pages. <https://en.wikipedia.org/wiki/Energy_filtered_transmission_electron_microscopy>.

* cited by examiner

SPECTROSCOPY IN A TRANSMISSION CHARGED-PARTICLE MICROSCOPE

TECHNICAL FIELD

The invention relates to a Transmission Charged-Particle Microscope, comprising: a specimen holder, for holding a specimen; a source, for producing a beam of charged particles; an illuminator, for directing said beam so as to irradiate the specimen; an imaging system, for directing a flux of charged particles transmitted through the specimen onto a spectroscopic apparatus comprising: a dispersing device, for dispersing said flux into an energy-resolved array of spectral sub-beams propagating substantially parallel to a propagation axis; a detector. The invention also relates to a method of using such a Transmission Charged-Particle Microscope. The invention additionally relates to a spectroscopic apparatus for use in such a microscope/method.

BACKGROUND

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:

In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes, and/or spectroscopic analysis (as in the case of EDX (Energy-Dispersive X-Ray Spectroscopy), for example).

In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image, or produce a spectrum (as in the case of EELS (Electron Energy-Loss Spectroscopy), for example). If such a TEM is operated in scanning mode (thus becoming a STEM), the image/spectrum in question will be accumulated during a scanning motion of the irradiating electron beam. More information on some of the topics elucidated here can, for example, be gleaned from the following Wikipedia links:

en.wikipedia.org/wiki/Electron microscope
en.wikipedia.org/wiki/Scanning electron microscope
en.wikipedia.org/wiki/Transmission electron microscopy
en.wikipeda.org/wiki/Scanning transmission electron microscopy As an alternative to the use of electrons as irradiating beam, charged-particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:

en.wikipedia.org/wiki/Scanning Helium Ion Microscope
W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).

It should be noted that, in addition to imaging and/or spectroscopy, a charged-particle microscope (CPM) may also have other functionalities, such as examining diffractograms, performing (localized) surface modification (e.g. milling, etching, deposition), etc.

In all cases, a Transmission Charged-Particle Microscope (TCPM) will comprise at least the following components:

A radiation source, such as a Schottky electron source or ion gun.

An illuminator, which serves to manipulate a "raw" radiation beam from the source and perform upon it certain operations such as focusing, aberration mitigation, cropping (with a stop/iris/condensing aperture), filtering, etc. It will generally comprise one or more charged-particle lenses, and may comprise other types of particle-optical component also. If desired, the illuminator can be provided with a deflector system that can be invoked to cause its output beam to perform a scanning motion across the specimen being investigated.

A specimen holder, on which a specimen under investigation can be held and positioned (e.g. tilted, rotated). If desired, this holder can be moved so as to effect a scanning motion of the beam w.r.t. the specimen. In general, such a specimen holder will be connected to a positioning system such as a mechanical stage.

An imaging system, which essentially takes charged particles that are transmitted through a specimen (plane) and directs (focuses) them onto analysis apparatus, such as a detection/imaging device, spectroscopic apparatus, etc. As with the illuminator referred to above, the imaging system may also perform other functions, such as aberration mitigation, cropping, filtering, etc., and it will generally comprise one or more charged-particle lenses and/or other types of particle-optical components.

SUMMARY

When a spectroscopic apparatus as referred to here is present, it will generally comprise: A dispersing device (comprising one or more "charged-particle prisms"), to disperse an incoming flux of charged particles (from the imaging system) into an energy-resolved array of spectral sub-beams, which can ultimately be directed onto a detection surface so as to form a spectrum. Basically, said incoming flux will contain electrons of various energies, and the dispersing device will "fan these out" (along a dispersion direction) into a collection (array) of individual sub-beams of given energies (in a manner somewhat reminiscent of a mass spectrometer).

A TCPM will also make use of: A detector, which may be unitary or compound/distributed in nature, and which can take many different forms, depending on the radiation/entity being recorded. As indicated above, such a detector may, for example, be used to register an intensity value, to capture an image, or to record a spectrum. Examples include photomultipliers (including solid-state photomultipliers, SSPMs), photodiodes, (pixelated) CMOS detectors, (pixelated) CCD detectors, photovoltaic cells, etc., which may, for example, be used in conjunction with a scintillator film, for instance.

In what follows, the invention may—by way of example—sometimes be set forth in the specific context of electron microscopy. However, such simplification is intended solely for clarity/illustrative purposes, and should not be interpreted as limiting.

An example of a TCPM as set forth above is a (S)TEM that is provided with an EELS module. Electron Energy-Loss Spectroscopy (EELS) is a technique used in (S)TEMs to obtain chemical information pertaining to a given specimen. A moving electron in an irradiating beam (from the (S)TEM's illuminator) can transfer energy to a bound electron in a core shell of an atom in the specimen, and promote this core electron to an outer shell (inelastic scattering). This energy-transfer from the moving electron gives rise to a so-called "core-loss peak" (CLP) in the EELS spectrum. The (coarse) position (in energy units) of the CLP is element-specific, and its precise position and shape are specific to the element's chemical environment and bonding. Typically, EELS modules can also be used as energy-selective imaging devices (EFTEMs: Energy-Filtered TEMs). To achieve this, they employ a slit ("letterbox") at/proximal their (primary) spectrum plane. When the module is used as a pure spectrometer, this slit is retracted, and the spectrum plane can be magnified and imaged onto the employed detector (camera) using post-slit optics. On the other hand, when the module is used as an energy-selective imaging device, the slit can be invoked to pass/admit only a specific energy window (typically of the order of 10-50 eV (electron Volts) wide); in that case, the post-slit optics then image a Fourier Transform plane of said spectrum plane onto the detector. For more information on EELS and EFTEM, reference is made to the following links:

en.wikipedia.org/wiki/Electron energy loss spectroscopy
en.wikipedia.org/wiki/Energy filtered transmission electron microscopy The current inventors make extensive use of EELS apparatus, and have found existing EELS modules to be unsatisfactory in many respects. Pursuant to substantial development and testing, they arrived at a number of improvements, which will be discussed in more detail below.

It is an object of the invention to provide an improved spectroscopic apparatus as referred to above, usable in a TCPM as alluded to heretofore. In particular, it is an object of the invention that such an apparatus should be more versatile than prior-art apparatus, and that it should allow more accurate spectroscopy results to be obtained.

These and other objects are achieved in a TCPM as specified in the opening paragraph, characterized in that the spectroscopic apparatus comprises an adjustable aperture device for defining an aperture in a path of said array, so as to select a subset of said array to be admitted to the detector, which aperture is delimited in a dispersion direction perpendicular to said propagation axis by first and second opposed edges, each of which edges is independently positionable relative to said propagation axis, thereby allowing independent adjustment of both of: a width of said aperture parallel to said dispersion direction; and a position of a center of said aperture relative to said propagation axis.

To aid clarification, one can introduce a Cartesian coordinate system (XYZ) in which: the propagation axis extends along the Z direction (conventionally defined as the direction of the (local) particle-optical axis in a CPM); the dispersion direction extends parallel to the X direction.

In such a coordinate system, the aperture of the current invention: has delimiting edges that are independently movable/positionable back and forth parallel to X; has a center line (defined as a line halfway between, and running parallel to, said edges) whose X position (relative to the Z axis) can be adjusted.

The inventive method is inherently different to the prior art inter alia in the following respects, whereby specific reference is made to EELS modules so as to give more definite examples:

Prior-art EELS modules only employ post-dispersion spatial filtering when they are in imaging/EFTEM mode, in which mode the abovementioned letterbox slit is invoked; when such modules are in spectroscopic/EELS mode, said slit is parked away from the post-dispersion sub-beams. In contrast, the current invention employs its adjustable aperture device in spectroscopic/EELS mode;

Known letterbox slits have fixed edges, whereas the aperture of the current invention is delimited/defined on two sides by movable edges. As a result, the width of the inventive aperture in the dispersion direction can be adjusted at will; and Because the delimiting edges of the inventive aperture are independently movable, the position of (the center of) the aperture relative to the propagation axis can also be adjusted at will.

Such independent adjustability allows the inventive aperture to be positioned exactly where it is wanted relative to the propagation axis, and to be sized at will. This flexibility/versatility, in turn, allows a variety of advantageous effects to be achieved, which will receive further elucidation below. It is worth noting that such flexibility is not achievable in, for example, scenarios such as the following (with reference to the Cartesian system introduced above):

If one delimiting edge of the aperture is fixed and the other edge is movable, then the X width ($W_X$) of the aperture and the X position ($P_X$) of the center of the aperture are interrelated, and therefore not independently adjustable. More specifically, $P_X$ will always occur a distance $1/2W_X$ from said fixed edge, and the only way to achieve a different $P_X$ will thus be to change $W_X$.

If both edges are constrained (e.g. by a cogging or scissors mechanism) to co-move symmetrically in reciprocating/opposed synchronization, then Wx is adjustable, but Px is not adjustable.

These points will receive further elucidation below.

In a particular embodiment of the invention, the inventive aperture device is adjusted so as to block stray radiation proximal to a periphery of said subset (of the dispersed array of spectral sub-beams) from reaching said detector (see FIG. 4A, for example). In such a scenario, the aperture works as a "clean-up aperture", defining an admittance threshold (at each of the aperture's opposed delimiting edges) at which:

At one side of the threshold (aperture side), selected components of the sub-beam array are admitted to the detector;

At the other side of the threshold, all incoming radiation (particularly "glare", "flare" and other categories of stray radiation) is impeded from reaching the detector.

By holding back such stray radiation, measurement noise is generally reduced, leading to an improved signal-to-noise ratio. This is, for example, important in EELS studies, where faint parts of an examined spectrum (such as abovementioned Core Loss Peaks, CLP) can be up to three orders of magnitude weaker in intensity than strong parts of the spectrum (such as the so-called Zero Loss Peak, ZLP)—see FIG. 3, in this regard. Moreover, ensuring that high-intensity stray radiation is accurately eclipsed allows the detector to be confidently set to a higher sensitivity, without fear of possible over-saturation/damage.

In another embodiment of the invention, the adjustable aperture device is employed to admit a relatively low-intensity subset of said array to said detector while eclipsing a relatively high-intensity portion of said array (see FIG. 4B, for example). This embodiment is somewhat similar to that described in the previous paragraph, in that the inventive aperture is used as a spatial filter; however, instead of excluding stray radiation (of a spurious nature), the current embodiment deliberately excludes a specific high-intensity spectral portion, which might otherwise overwhelm the employed detector. An example of a situation where such exclusion can be useful can again be drawn from EELS studies. As is evident from FIG. 3, for example, a typical EELS spectrum will not only comprise the ZLP and CLP components referred to above, but also an intermediate Plasmon Resonance Peak (PRP) component, associated with inelastic scattering of electrons on plasmons in the specimen under study, and with an intensity typically intermediate between that of the ZLP and CLP spectral components. Because of the (aforementioned) relatively large intensity differences between these ZLP, PRP and CLP components, and also in view of their relatively large energy separation (which can easily be of the order of 500 eV, where 0.2 eV resolution is required/desired), simultaneous recording of these components is generally not an option, and one must instead resort to switching between and recording given components one at a time, with optimized detector settings (e.g. sensitivity, exposure time) for the component in question. One way of switching between spectral components is known from so-called Dual EELS techniques—e.g. as set forth in U.S. Pat. No. 7,642,513—in which high-speed deflectors are used to select the spectral component falling upon the detector at a given time, in combination with an ultra-fast beam blanker to achieve short exposure times when required (e.g. when recording the ZLP). However, the current embodiment offers an alternative, in that it achieves switching between spectral components using the inventive adjustable aperture rather than deflectors.

For example: The adjustable aperture device can be configured so as to admit the relatively high-energy-loss CLP component [admitted subset] to said detector, whilst blocking out the spectral sub-beams of the lower-energy-loss components (comprising the ZLP/PRP components) [eclipsed portion]. Because the detector is only exposed to the relatively faint, high-energy-loss CLP component, its sensitivity/exposure time can be optimized to record this. Similarly, one could configure the adjustable aperture device so as to admit the PRP component [admitted subset] to said detector, whilst blocking out the ZLP and CLP components [eclipsed portion]. Alternatively, one can configure the adjustable aperture device so as to admit the ZLP component to said detector, whilst blocking out the PRP and CLP components.

Separately measuring the ZLP, PRP and CLP components in this manner allows a whole scala of follow-on data processing to be performed. For example:

The CLP and PRP spectral components are generally convoluted, because a given electron entering an EELS module can, in general, have caused a mixture of (inner-shell) CLP and (outer-shell) PRP "events" in the specimen under investigation. If the CLP and PRP components are separately measured, they can be deconvoluted ("disentangled") using known mathematical procedures based, for example, on Bayesian, Fourier Log or Fourier Ratio techniques. The skilled artisan in the field of spectral analysis will be familiar with such mathematical techniques, but, for more information, reference is made to the book (Chapter 4, in particular) by Ray Egerton, "Electron Energy-Loss Spectroscopy in the Electron Microscope", third edition, 2011, ISBN 978-1-4419-9583-4, Springer Science & Business Media (pub.).

The ZLP can act as an absolute energy reference for the PRP/CLP parts of a spectrum, because the energy of electrons in the incoming flux is known (on the basis of the employed (resultant) acceleration potential) and the ZLP portion of the spectrum effectively "preserves" this energy. By comparing the peak positions in the CLP/PRP component to the ZLP peak position, an absolute (rather than relative) energy scale can be associated with them.

A comparison of an integrated intensity of the (ZLP+PRP) components relative to an integrated intensity of the PRP component can allow one to deduce the thickness of the specimen under investigation (see, for example, the abovementioned book by Egerton).

In the discussion in the previous paragraph, the portion of the spectral array of sub-beams that was impeded from reaching the detector (at a given time) was eclipsed totally. However, such eclipse can also be partial, whereby, in addition to the subset of sub-beams admitted through the aperture, a given fraction of the sub-beams falling (in a given zone) outside the delimiting edges of the aperture will also be allowed to reach the detector in attenuated form (see FIG. 4C, for example). Such an embodiment is advantageous in that it allows a relatively high-intensity portion of the spectrum (such as the ZLP) to be passed to the detector in dimmed form, thus allowing the sensitivity of the detector and/or exposure time to be increased without an attendant risk of over-saturation. With such a set-up, it is therefore possible, for example, to concurrently record both an (admitted) CLP spectral subset and an (attenuated/partially eclipsed) ZLP spectral portion in a single detector acquisition, with good signal-to-noise ratio. Examples of constructions capable of achieving such partial eclipsing will receive further attention below.

In another embodiment of the invention, the spectroscopic apparatus is an EFTEM module (or an EELS module used in EFTEM mode), and the center of the inventive aperture is adjusted to substantially coincide with an optical axis of post-aperture focusing optics disposed between the adjustable aperture device and the detector. Conventionally, the center of the energy selection ("letterbox") slit in an EFTEM module cannot be adjusted in position (more specifically: in the X direction of the Cartesian system introduced above); instead, its location is determined by how particular mechanical tolerances happen to add up for a specific instance of the spectrometer. The (particle-)optical axis is then generally aligned to run through the center of the slit, because this typically gives greatest ease-of-use for the operator. However, the center of the slit does not necessarily coincide with the center of (focusing) particle-optical elements disposed before (upstream of) and after (downstream of) the slit. Consequently, such alignment will typically not give optimum optical performance (e.g. in terms of aberration control). In the current embodiment, this problem is circumvented by virtue of the fact that the (center of the) inventive aperture is freely adjustable in the dispersion direction (X direction). This adjustability can be used to align the center of the aperture with the optical axis of (focusing) particle-optical elements located after (and before) the aperture, thus optimizing both optical performance and ease-of-use for the operator.

For the sake of completeness, it should be noted that, if desired, the aperture device according to the present invention can be entirely shut (corresponding to an aperture width of zero), so that it acts as a full beam stop. Consequently, the inventive aperture device can not only act as a spatial filter/spectral selector, but also as a beam blanker.

In principle, the adjustable aperture device of the present invention can take various possible forms; however, in a specific embodiment of the invention, it comprises first and second plates that are substantially coplanar within an aperture plane, respectively comprise said first and second edges, and are respectively connected to first and second actuators that can be used to independently position them within said aperture plane. In a preferential configuration, the aperture is elongate, and extends substantially perpendicular to said dispersion direction (i.e. it extends parallel to Y in the Cartesian system defined above, with an adjustable width parallel to X). The (knife) edges of the opposing plates may be straight or curved, as desired. Said actuators may, for example, be piezo motors, stepper motors, voice coil motors, pneumatic/hydraulic drives, etc. In particular, piezo motors are a good choice, because they are generally relatively small, cheap and fast, and very accurate. The skilled artisan will understand that said aperture plane is advantageously disposed at or proximal to a dispersion plane of the spectroscopic apparatus.

In a particular embodiment of a device as set forth in the previous paragraph, (at least) a first zone proximal to (at least) said first edge of (at least) said first plate is provided with an attenuating structure that partially transmits sub-beams impinging on said zone. Such an embodiment can be used to produce the partial eclipsing effect referred to above. The zone in question may, for example, comprise a matrix distribution of small holes/openings in the first (metal) plate (somewhat like a cheese grater). However, in a particular configuration, the attenuating structure is a slit that starts at, and extends away from, said first edge. With reference to the Cartesian system introduced above, such a slit can, for example, extend for a limited distance in X, and have a relatively small width in Y. If the spectral sub-beams falling on the slit have a non-zero extent in Y (as will generally be the case), only a relatively small part of this extent will be admitted through the slit.

As already mentioned above, the current invention offers an alternative to known Dual-EELS techniques, in that the inventive adjustable aperture device can be used instead of deflectors to effect switching between sequentially visited spectral components.

More specifically, such an embodiment of the current invention comprises the following steps:
  Adjusting the adjustable aperture device so as to admit a first subset of the array (of spectral sub-beams) to a first area of the employed detector;
  Registering said first subset using the detector;
  Adjusting the adjustable aperture device so as to admit a second subset of the array to a second area of the detector, the second subset and area being different to the first subset and area, respectively;
  Registering the second subset using the detector.

Needless to say, the detector settings (such as sensitivity, acquisition time, etc.) can be adjusted between said first and second registration events, in order to optimally deal with any significant disparity (e.g. vis-a-vis intensity) between said first and second spectral subsets (such as the ZLP and CLP components of an EELS spectrum, for example, which might be registered using respective detector exposure times of 1 μs and 10 ms, for instance). Although only described here for first and second spectral subsets/detector areas, this embodiment can also be extrapolated to larger pluralities of (sequentially visited) subsets/areas, e.g. allowing triple or quadruple registrations on three or four different areas of the detector, for instance. The relative positioning/width of the registration areas on the detector will correspond to the relative positioning/width of the associated selected spectral subsets.

BRIEF DESCRIPTION OF THE DRAWINGS

The invention will now be elucidated in more detail on the basis of exemplary embodiments and the accompanying schematic drawings, in which.

In the Figures, where pertinent, corresponding parts are indicated using corresponding reference symbols. It should be noted that, in general, the Figures are not to scale.

DETAILED DESCRIPTION

Embodiment 1

Figure 1:
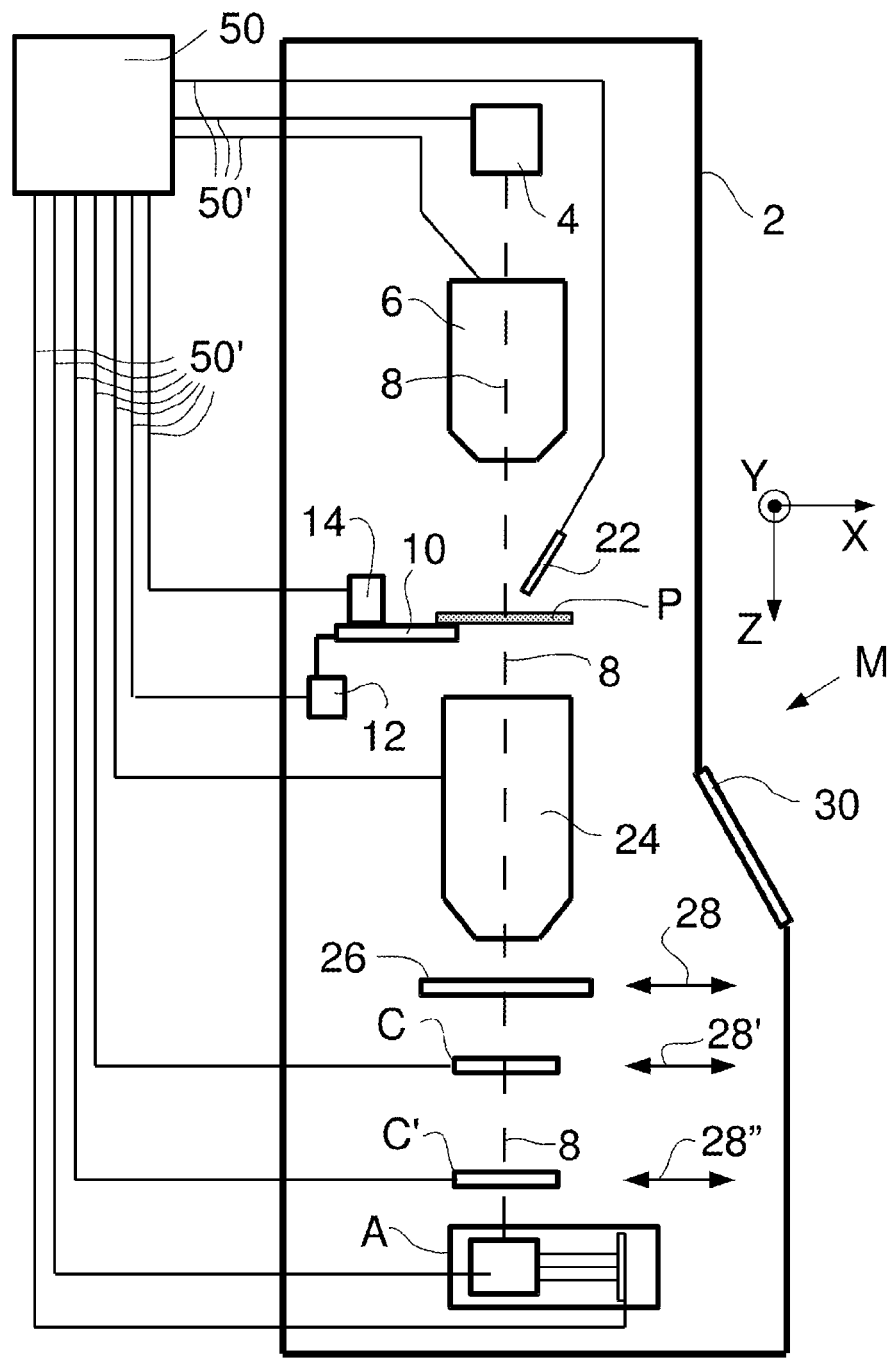
FIG. 1 renders a longitudinal cross-sectional view of a charged-particle microscope in which an embodiment of the current invention is enacted.

FIG. 1 is a highly schematic depiction of an embodiment of a TCPM M that lends itself to use in conjunction with the current invention; the depicted microscope is a TEM/STEM (i.e. a TEM, with scanning functionality) but, in the context of the current invention, it could just as validly be an ion-based microscope, for example. In the Figure, within a vacuum enclosure 2, an electron source 4 (such as a Schottky gun, for example) produces a beam of electrons that traverse an electron-optical illuminator 6, serving to direct/focus them onto a chosen part of a specimen P (which may, for example, be (locally) thinned/planarized). This illuminator 6 has an electron-optical axis 8, and will generally comprise a variety of electrostatic/magnetic lenses, (scan) deflectors, correctors (such as stigmators), etc.; typically, it can also comprise a condenser system (the whole of item 6 is sometimes referred to as "a condenser system").

The specimen P is held on a specimen holder 10 that can be positioned in multiple degrees of freedom by a positioning device (stage) 12; for example, the specimen holder 10 may comprise a finger that can be moved (inter alia) in the XY plane (see the depicted Cartesian coordinate system; typically, motion parallel to Z and tilt about X/Y will also be possible). Such movement allows different parts of the specimen P to be irradiated/imaged/inspected by the electron beam traveling along axis 8 (in the Z direction) (and/or allows scanning motion to be performed, as an alternative to beam scanning). An optional cooling device 14 is in intimate thermal contact with the specimen holder 10, and is capable of maintaining the latter at cryogenic temperatures, e.g. using a circulating cryogenic coolant to achieve and maintain a desired low temperature.

The (focused) electron beam traveling along axis 8 will interact with the specimen P in such a manner as to cause various types of "stimulated" radiation to emanate from the specimen P, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen P, emerge from it and continue to propagate (substantially, though generally with some deflection/scattering) along axis 8. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 28) so as to get it out of the way of axis 8. An image (or diffractogram) of (part of) the specimen P will be formed by imaging system 24 on screen 26, and this may be viewed through viewing port 30 located in a suitable part of the wall 2. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various other types of analysis apparatus can be used downstream of screen 26, such as:

TEM camera C. At camera C, the electron flux can form a static image (or diffractogram) that can be processed by controller 50 and displayed on a display device (not depicted), such as a flat panel display, for example. When not required, camera C can be retracted/withdrawn (as schematically indicated by arrows 28') so as to get it out of the way of axis 8.

STEM detection device C'. An output from device C' can be recorded as a function of (X,Y) scanning beam position on the specimen P, and an image can be constructed that is a "map" of output from C' as a function of X,Y. Device C' can comprise a single pixel with a diameter of e.g. 20 mm, as opposed to the matrix of pixels characteristically present in camera C. Moreover, device C' will generally have a much higher acquisition rate (e.g. $10^6$ points per second) than camera C (e.g. $10^2$ images per second). Once again, when not required, device C' can be retracted/withdrawn (as schematically indicated by arrows 28") so as to get it out of the way of axis 8 (although such retraction would not be a necessity in the case of a donut-shaped annular dark field detection device C', for example; in such a device, a central hole would allow beam passage when the device was not in use).

As an alternative to imaging using camera C or device C', one can also invoke spectroscopic apparatus A, which, in the current example, is an EELS module. The further structure and operation of spectroscopic apparatus A will be elucidated below with reference to FIG. 2.

It should be noted that the order/location of items C, C' and A is not strict, and many possible variations are conceivable. For example, spectroscopic apparatus A can also be integrated into the imaging system 24.

Note that the controller (computer processor) 50 is connected to various illustrated components via control lines (buses) 50'. This controller 50 can provide a variety of functions, such as synchronizing actions, providing setpoints, processing signals, performing calculations, and displaying messages/information on a display device (not depicted). Needless to say, the (schematically depicted) controller 50 may be (partially) inside or outside the enclosure 2, and may have a unitary or composite structure, as desired. The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis 8, taking the form of a small tube (e.g. of the order of 1 cm in diameter) through which the employed electron beam passes, but widening out to accommodate structures such as the source 4, specimen holder 10, screen 26, camera C, detection device C', spectroscopic apparatus A, etc.

Figure 2:
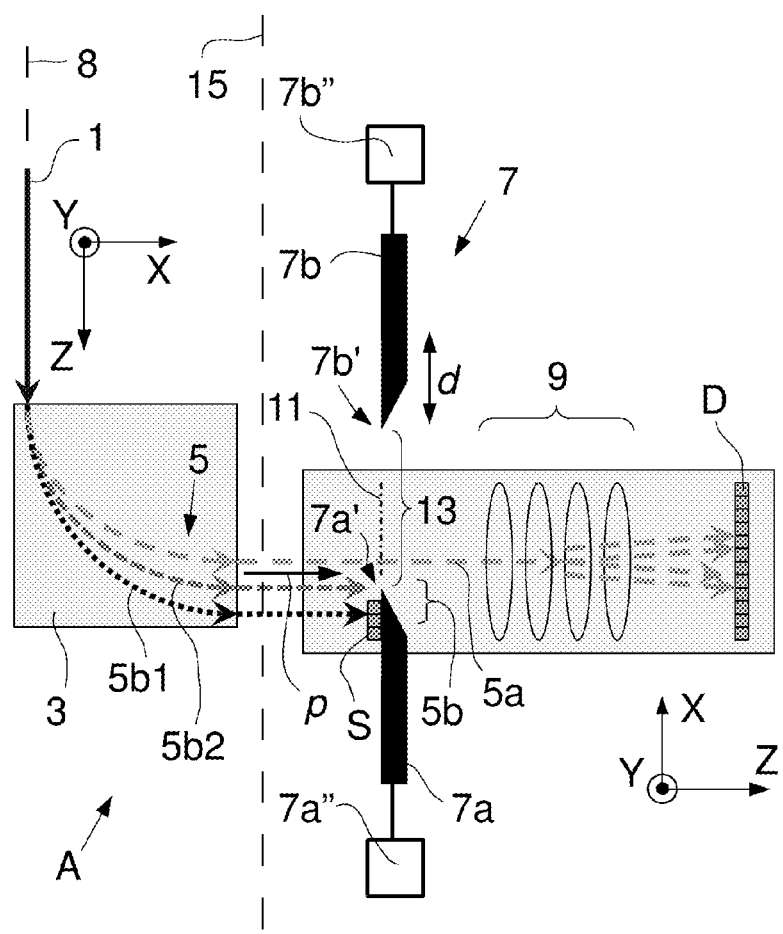
FIG. 2 renders an enlarged longitudinal cross-sectional view of part of the subject of FIG. 1, namely a spectroscopic apparatus in which an embodiment of the present invention is enacted.

Turning now to FIG. 2, this shows an enlarged and more detailed view of the spectroscopic apparatus A in FIG. 1. In the Figure, a flux 1 of electrons is shown propagating along electron-optical axis 8. This flux 1 enters a dispersing device 3 ("electron prism"), where it is dispersed (fanned out) parallel to a dispersion direction d into an energy-resolved (energy-differentiated) array 5 of spectral sub-beams (schematically indicated in FIG. 2 using dashed lines), which propagate substantially parallel to a propagation axis p. Note that the Cartesian coordinate system depicted at the lower right of FIG. 2 (and, more generally, applicable to the right of dashed line 15) is rotated counterclockwise through 90° compared to the coordinate system at the upper left of the Figure (and, more generally, applicable along axis 8); this is because, conventionally, the Z axis is used to indicate the direction of the (local) electron-optical axis, which starts off vertical (line 8; FIG. 1) but is deflected in dispersing device 3 so as to become horizontal (line p). The skilled artisan will grasp that there is some flexibility in defining the location of the propagation axis p, whose (vectorial) direction is more important than its particular spatial location; for example, one may define it as lying along a line of travel of a particular sub-beam in the array 5 (such as the ZLP), or as being located at a median position of the array 5 (half way between given extremities), etc. Having traversed the dispersing device 3, the array 5 of sub-beams encounters an adjustable aperture device 7, which comprises:

A first plate 7a, having a first (knife) edge 7a', and connected to a first actuator 7a" that can be used to position plate 7a at will in (at least) a direction parallel to the dispersion direction d;

A second plate 7b, having a second (knife) edge 7b', and connected to a second actuator 7b" that can be used to position plate 7b at will in (at least) a direction parallel to the dispersion direction d, whereby plate 7b is arranged to be substantially co-planar with plate 7a, within an aperture plane 11 (extending substantially parallel to direction d).

An aperture (gap, mouth) 13 between the two edges 7a', 7b'. If one defines an X-coordinate of edge 7a' as Xa, and an X-coordinate of edge 7b' as Xb, then, by adjusting the X-positions of plates 7a,7b within the plane 11 (using respective actuators 7a",7b"), it is possible to independently alter:

A width W of aperture 13 parallel to dispersion direction d, where W=|Xb−Xa|;

A center position C of aperture 13 relative to propagation axis p, where, for example, C=1/2(Xb+Xa) if p is defined as corresponding to the Z axis (X=0).

In use, the inventive aperture device 7 can be employed in various different ways as a spatial filter/spectral selector. In general terms, it can be adjusted so as to admit a particular subset 5a of array 5 to a detector D (e.g. a pixelated CMOS or CCD detector), while blocking/eclipsing a particular portion 5b of array 5 from reaching detector D. Before reaching detector D, admitted subset 5a proceeds through post-aperture charged-particle (electron) optics 9, where it is magnified/focused, for example. The subset 5a and portion 5b will each generally comprise a non-zero bandwidth of sub-beams. Particular scenarios involving specific settings of the aperture 13 (and corresponding to given examples discussed above) will be elucidated in more detail in Embodiment 3 below, with reference to FIGS. 4A-4C.

Also depicted in FIG. 2 is an optional, ancillary radiation sensor S, which is here attached to first plate 7a proximal to first edge 7a' so as to face toward the incoming array 5 of sub-beams. The sensor S is relatively small, e.g. with a sensing area of a few mm$^2$, and is, for example, embodied as a photodiode, SSPM or (small) CMOS/CCD sensor. This sensor S can be used to perform localized radiation sensing in a selected region of the blocked portion 5b of the array 5, simultaneous with detection of subset 5a by detector D. Its operation and application are described in more detail in co-pending European Patent Application EP 14183576.9 (corresponding to U.S. patent application Ser. No. 14/844,778, which is hereby incorporated by reference), which has the same inventors as the current invention.

Embodiment 2

Figure 3:
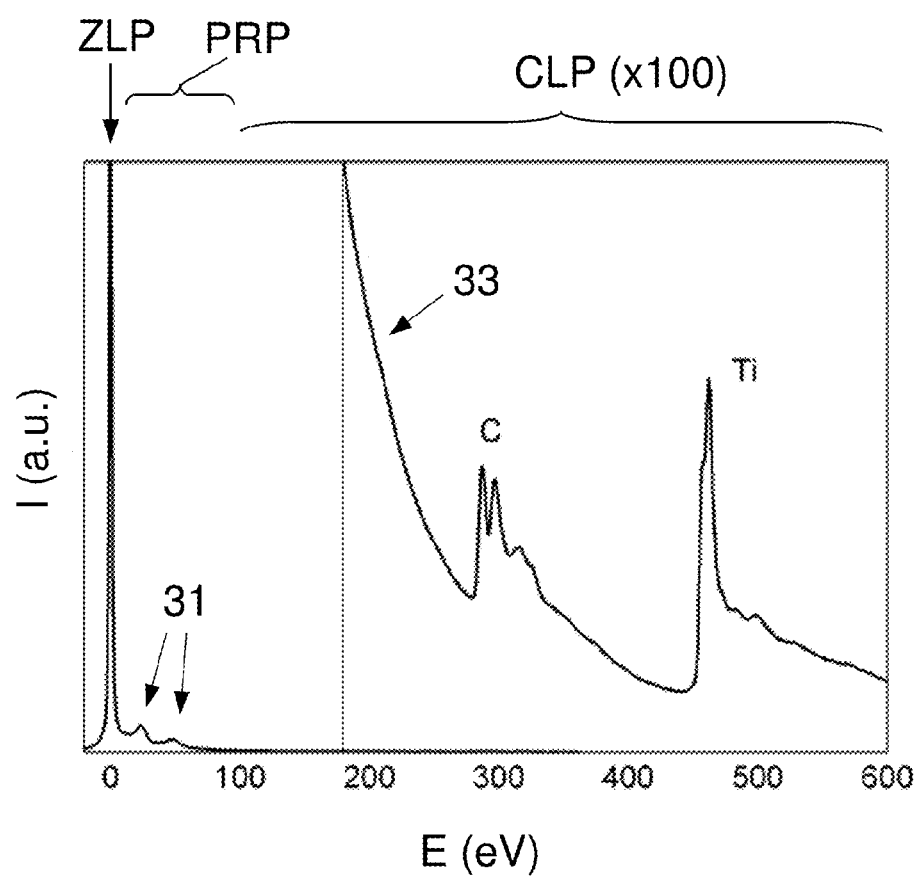
FIG. 3 shows an example of an EELS spectrum.

FIG. 3 shows an example of an EELS spectrum. The Figure renders intensity I (in arbitrary units, a.u.) as a function of energy-loss E (in eV) for electrons that have traversed a specimen containing Carbon and Titanium. From left to right, the main features of the spectrum are:
  A Zero-Loss Peak ZLP, representing electrons that traverse the specimen without undergoing inelastic scattering therein.
  A Plasmon Resonance Peak component/section PRP (sometimes referred to as a Valence Loss component). This typically extends from about 0-50 eV, although there is no strict definition of its upper limit. It is characterized by peaks/shoulders resulting from outer-shell scattering events in the specimen, such as peaks 31. Note that the PRP component has a much lower intensity than the ZLP.
  A Core Loss Peak component/section CLP. This typically starts at about 50 eV (after the PRP component), although there is no strict definition of its lower limit. It is typically of such a low intensity relative to the ZLP/PRP components that, as rendered in FIG. 3, it is enlarged by a factor 100 to improve visibility of its details. As can be seen, it contains (clusters of) peaks/shoulders that can be associated with certain chemical elements (such as C and Ti, in the current example), seated on top of a substantial background contribution 33.

Embodiment 3

Figure 4A:
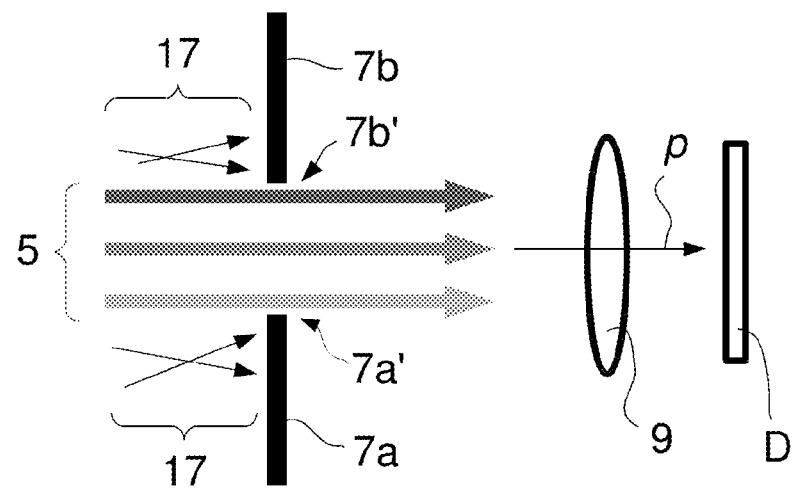
FIGS. 4A-4C schematically depict various configurations according to which the current invention can be applied, illustrated using certain parts from FIG. 2.
Figure 4B:
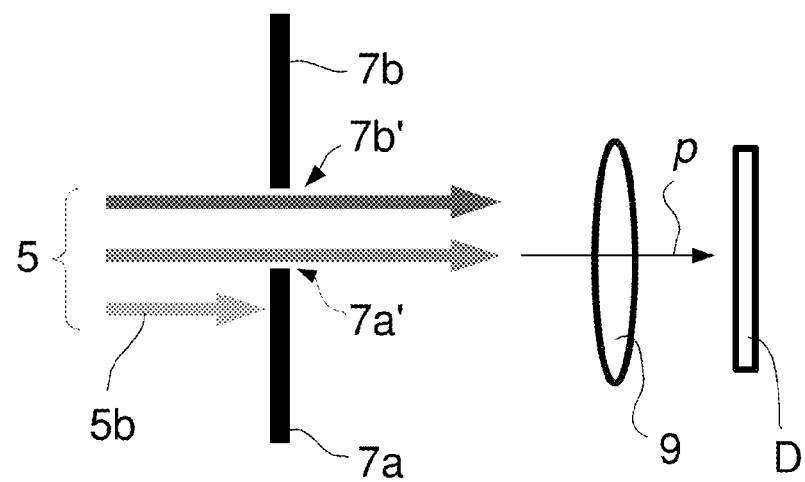
Figure 4C:
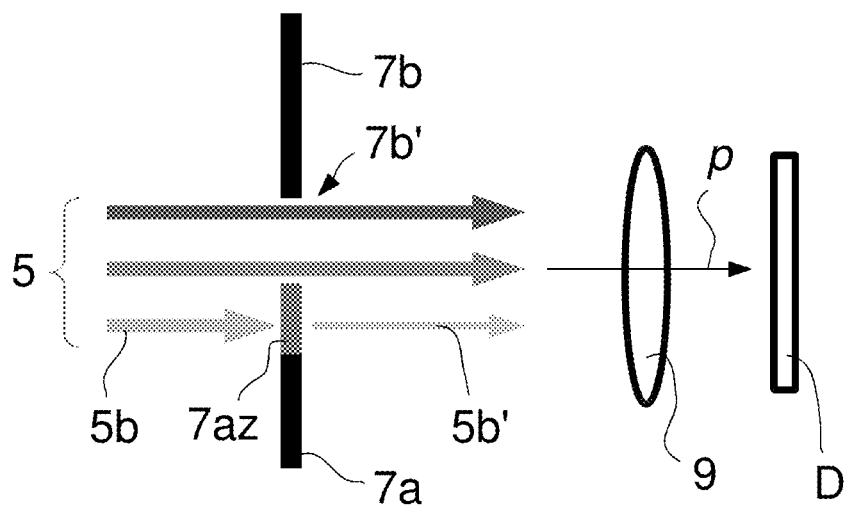

FIGS. 4A-4C schematically depict various configurations according to which the current invention can be applied, illustrated using certain parts from FIG. 2. The depicted scenarios are as follows. In, FIG. 4A, the blades 7a, 7b are positioned so as to admit essentially the whole array 5 of sub-beams toward the detector D. However, the delimiting aperture edges 7a', 7b' are positioned close to the periphery of the array 5, so as to block stray radiation (electrons) 17 from reaching the detector D.

In, FIG. 4B, blade 7a has been pushed upward relative to the situation depicted in FIG. 4A, thereby totally eclipsing a portion 5b of the array 5 (in addition to blocking stray radiation). For example, the blocked/eclipsed portion 5b may comprise a relatively high-intensity EELS ZLP spectral component.

In, FIG. 4C, blade 7a comprises a zone 7az (proximal to its exposed/extremal edge) provided with an attenuating structure (such as a slit, or matrix of holes) that partially transmits sub-beams impinging on the zone 7az. As a result, intercepted portion 5b of the array 5 is now only partially eclipsed, and is admitted in attenuated form as portion 5b'. Once again, partially eclipsed/attenuated portion 5b/5b' may comprise the relatively high-intensity ZLP component of an EELS spectrum.

Needless to say, although the discussions of FIGS. 4B and 4C above specifically mention movement/positioning of blade 7a, they could just as validly involve movement/positioning of blade 7b (either alternatively or supplementally).

The invention claimed is:
1. A Transmission Charged-Particle Microscope, comprising:
  a specimen holder, for holding a specimen;
  a source, for producing a beam of charged particles;
  an illuminator, for directing said beam so as to irradiate the specimen;
  an imaging system, for directing a flux of charged particles transmitted through the specimen onto a spectroscopic apparatus comprising:
    a dispersing device, for dispersing said flux into an energy-resolved array of spectral sub-beams propagating substantially parallel to a propagation axis; and
    a detector; and
    an adjustable aperture device for defining an aperture in a path of said array, so as to select a subset of said array to be admitted to the detector, which aperture is delimited in a dispersion direction perpendicular to said propagation axis by first and second opposed edges, each of which edges is independently positionable relative to said propagation axis, thereby allowing independent adjustment of both of:
      a width of said aperture parallel to said dispersion direction; and
      a position of a center of said aperture relative to said propagation axis,
    wherein said adjustable aperture device comprises first and second plates that are substantially coplanar within an aperture plane, respectively comprise said first and second edges, and wherein: a first zone proximal to said first edge of said first plate is provided with an attenuating structure that at a given time partially transmits and partly eclipses, individual sub-beams of the energy-resolved spectral array impinging on said zone; and configured such that the attenuating structure at least partially eclipses, energy selectively, a relatively high-intensity portion of the charged particles transmitted through the specimen.

2. A microscope according to claim 1, wherein said spectroscopic apparatus is an electron energy-loss spectroscopy (EELS) module.

3. A microscope according to claim 2, wherein said-first and second plates are respectively connected to first and second actuators that can be used to independently position them within said aperture plane.

4. A microscope according to claim 2, wherein said attenuating structure is a slit that starts at, and extends into the first plate away from, said first edge.

5. A microscope according to claim 2, wherein said attenuating structure is a matrix of holes.

6. A microscope according to claim 1, wherein said-first and second plates are respectively connected to first and second actuators that can be used to independently position them within said aperture plane.

7. A microscope according to claim 1, wherein said attenuating structure is a slit that starts at, and extends away from, said first edge into the first plate.

8. A microscope according to claim 1, wherein said attenuating structure is a matrix of holes.

9. A spectroscopic apparatus comprising:
a dispersing device, for dispersing a flux of charged particles into an energy-resolved array of spectral sub-beams propagating substantially parallel to a propagation axis;
a detector;
an adjustable aperture device for defining an aperture in a path of said array, so as to select a subset of said array to be admitted to the detector, which aperture is delimited in a dispersion direction perpendicular to said propagation axis by first and second opposed edges, each of which edges is independently positionable relative to said propagation axis, thereby allowing independent adjustment of both of:
a width of said aperture parallel to said dispersion direction; and
a position of a center of said aperture relative to said propagation axis
wherein said adjustable aperture device comprises first and second plates that are substantially coplanar within an aperture plane, respectively comprise said first and second edges, and wherein; a first zone proximal to said first edge of said first plate is provided with an attenuating structure that at a given time partially transmits and partly individual sub-beams of the energy-resolved spectral array impinging on said zone; and configured such that the attenuating structure at least partially eclipses, energy selectively, a relatively high-intensity portion of the charged particles transmitted through the specimen.

* * * * *